(12) United States Patent
Bezginas

(10) Patent No.: US 9,905,213 B2
(45) Date of Patent: Feb. 27, 2018

(54) SOLAR GUITAR

(71) Applicant: Aleks Bezginas, New York, NY (US)

(72) Inventor: Aleks Bezginas, New York, NY (US)

( * ) Notice: Subject to any disclaimer, the term of this patent is extended or adjusted under 35 U.S.C. 154(b) by 0 days.

(21) Appl. No.: 15/207,318

(22) Filed: Jul. 11, 2016

(65) Prior Publication Data
US 2017/0011726 A1    Jan. 12, 2017

Related U.S. Application Data

(60) Provisional application No. 62/190,314, filed on Jul. 9, 2015.

(51) Int. Cl.
  *G10H 3/18*    (2006.01)
  *G10H 1/46*    (2006.01)
  (Continued)

(52) U.S. Cl.
  CPC ............. *G10H 3/186* (2013.01); *G10D 1/085* (2013.01); *G10D 3/02* (2013.01); *G10G 5/00* (2013.01); *G10G 5/005* (2013.01); *G10G 7/005* (2013.01); *G10H 1/46* (2013.01); *H01L 31/042* (2013.01); *H02J 7/355* (2013.01); *H02S 40/38* (2014.12); *G10H 2220/091* (2013.01); *G10H 2230/035* (2013.01); *H04R 1/08* (2013.01); *Y02E 10/50* (2013.01)

(58) Field of Classification Search
  CPC .... G10H 3/186; G10H 1/46; G10H 2220/091; G10H 2230/035; H02S 40/38; G10D 1/085; G10D 3/02; G10G 5/00; G10G 5/005; G10G 7/005; H01L 31/042; H02J 7/355; H04R 1/08; Y02E 10/50

USPC .......................................................... 84/743
  See application file for complete search history.

(56) References Cited

U.S. PATENT DOCUMENTS

| 504,283 A | 8/1893 | Shepperd |
| 4,201,108 A | 5/1980 | Bunker |

(Continued)

FOREIGN PATENT DOCUMENTS

| CN | 2030786 U | 1/1989 |
| CN | 2549564 Y | 5/2003 |

(Continued)

OTHER PUBLICATIONS

Quinn.M. Research Set to Music: The Climate Symphony and Other Sonifications of Ice Core, Radar, DNA, Seismic and Solar Wind Data. Proceedings of the International Conference on Auditory Dispay (ICAD2001), Espoo, Finland.

*Primary Examiner* — David Warren
*Assistant Examiner* — Christina Schreiber
(74) *Attorney, Agent, or Firm* — The Rapacke Law Group, P.A.

(57) ABSTRACT

A musical instrument, having; at least one solar panel which corresponds to the body of the musical instrument, where the at least one solar panel is outwardly facing the sun; a battery to store solar energy; a power control board; an amplifier; an interactive display for monitoring a plurality of levels corresponding to a variety of components of the musical instrument; a strap connected to the musical instrument; the strap has at least one solar panel; at least one speaker for emitting sound; a bridge; a port; a stand, where the stand has at least one solar panel; and a carrying case; where the carrying case has at least one solar panel.

11 Claims, 5 Drawing Sheets

(51) Int. Cl.

| | |
|---|---|
| *H02S 40/38* | (2014.01) |
| *G10D 1/08* | (2006.01) |
| *G10D 3/02* | (2006.01) |
| *G10G 5/00* | (2006.01) |
| *G10G 7/00* | (2006.01) |
| *H01L 31/04* | (2014.01) |
| *H02J 7/35* | (2006.01) |
| *H04R 1/08* | (2006.01) |
| *H01L 31/042* | (2014.01) |

(56) References Cited

U.S. PATENT DOCUMENTS

| | | |
|---|---|---|
| 5,788,555 A | 8/1998 | Glynn |
| 6,547,321 B2 | 4/2003 | Wu |
| 6,664,461 B2 | 12/2003 | Tamura |
| 6,696,632 B2 | 2/2004 | Minakuchi et al. |
| 6,721,430 B2 * | 4/2004 | Wang .............. H04R 5/023 381/301 |
| 6,855,879 B2 | 2/2005 | Minakuchi et al. |
| 6,891,099 B1 * | 5/2005 | Davis .............. G10G 5/00 84/421 |
| 6,916,981 B2 * | 7/2005 | Matsui .............. H01G 9/2031 136/250 |
| 7,112,732 B2 | 9/2006 | Tamura |
| 7,785,098 B1 * | 8/2010 | Appleby .............. B29C 33/302 264/319 |
| 8,383,923 B2 * | 2/2013 | Hacker .............. G09B 15/00 84/470 R |
| 8,476,519 B2 * | 7/2013 | Liotta .............. H04R 1/1033 2/90 |
| 8,901,403 B2 * | 12/2014 | Barnett .............. G10G 5/005 84/327 |
| 9,206,309 B2 * | 12/2015 | Appleby .............. B22C 9/04 |
| 9,282,388 B2 * | 3/2016 | Wegener .............. H04R 1/028 |
| 2003/0155583 A1 * | 8/2003 | Matsui .............. H01G 9/2031 257/200 |
| 2008/0092723 A1 * | 4/2008 | Sawyer-Kovelman .............. G10H 1/0016 84/724 |
| 2010/0108113 A1 | 5/2010 | Taggart et al. |
| 2010/0122621 A1 * | 5/2010 | Newstetter .............. G10G 1/02 84/314 R |
| 2010/0252025 A1 * | 10/2010 | Kroizer .............. F24J 2/0494 126/600 |
| 2011/0002094 A1 * | 1/2011 | Blouin .............. A45C 1/06 361/679.01 |
| 2011/0215208 A1 * | 9/2011 | Campagna .............. B23P 11/00 248/158 |
| 2011/0280427 A1 | 11/2011 | Buyens |
| 2012/0235477 A1 * | 9/2012 | Korman .............. H01L 31/042 307/11 |
| 2013/0019736 A1 * | 1/2013 | Finkle .............. G10D 3/00 84/313 |
| 2013/0322673 A1 * | 12/2013 | Yuhara .............. G10G 7/005 381/334 |
| 2015/0114210 A1 * | 4/2015 | Ho .............. G10D 13/024 84/723 |
| 2015/0370533 A1 * | 12/2015 | Johnson .............. G06F 3/167 455/563 |
| 2017/0011726 A1 * | 1/2017 | Bezginas .............. G10H 3/186 |

FOREIGN PATENT DOCUMENTS

| | | | | |
|---|---|---|---|---|
| CN | 101257266 A | | 9/2008 | |
| CN | 201949587 U | * | 8/2011 | |
| CN | 102243864 A | | 11/2011 | |
| CN | 102243864 A | * | 11/2011 | |
| CN | 202093809 U | | 12/2011 | |
| CN | 103761957 A | * | 4/2014 | |
| CN | 204884542 U | * | 12/2015 | |
| CN | 205282074 U | * | 6/2016 | |
| CN | 106297751 A | * | 1/2017 | |
| CN | 106847242 A | * | 6/2017 | |
| DE | 360764 C | | 10/1922 | |
| DE | 454186 C | | 12/1927 | |
| DE | 912044 C | | 5/1954 | |
| DE | 1885390 U | | 1/1964 | |
| DE | 8232675 U1 | | 5/1983 | |
| DE | 8702748 U1 | | 7/1987 | |
| DE | 3616732 C2 | | 11/1987 | |
| DE | 3722311 A1 | | 1/1989 | |
| DE | 3815098 A1 | | 11/1989 | |
| DE | 3923996 A1 | | 1/1991 | |
| DE | 4303274 C2 | | 2/1997 | |
| DE | 19540668 A1 | * | 5/1997 | ............ G10D 1/085 |
| DE | 10004712 C1 | | 8/2001 | |
| DE | 10149166 C1 | | 2/2003 | |
| DE | 10253941 B4 | | 7/2003 | |
| DE | 10253150 B4 | | 8/2003 | |
| DE | 102004003151 A1 | | 8/2005 | |
| DE | 202009003886 U1 | | 8/2005 | |
| DE | 102004010844 A1 | | 10/2005 | |
| DE | 202006012202 U1 | | 9/2006 | |
| DE | 102005022701 A1 | | 11/2006 | |
| DE | 202007000427 U1 | | 3/2007 | |
| DE | 102005054057 A1 | | 6/2007 | |
| DE | 102004005120 A1 | | 1/2008 | |
| DE | 202007002048 U1 | | 6/2008 | |
| DE | 10112313 A1 | | 11/2011 | |
| EP | 0192020 A2 | | 8/1986 | |
| EP | 0192936 B1 | | 9/1986 | |
| EP | 0626604 A2 | | 11/1994 | |
| EP | 1127983 A2 | | 8/2001 | |
| GB | 2119148 A | | 11/1983 | |
| KR | 20120063620 A | * | 6/2012 | |
| KR | 20150032761 A | * | 3/2015 | |
| WO | WO2003047441 A1 | | 6/2003 | |
| WO | WO2009007818 A2 | | 1/2009 | |

* cited by examiner

SOLAR GUITAR

CLAIM OF PRIORITY

This application claims priority to U.S. Patent Provisional Application No. 62/190,314 filed Jul. 9, 2015, the contents of which are hereby incorporated by reference in their entirety therein.

FIELD OF THE EMBODIMENTS

The field of the present invention and its embodiments relate to a musical instrument powered by solar energy.

BACKGROUND OF THE EMBODIMENTS

The electric guitar, first patented in the U.S under U.S. Pat. No. 2,089,171, taught electric guitar as solid and thin, as opposed to an acoustic guitar, which is hollow and creates sound through resonance. Typically, guitars are made of wood for a warmer tonal quality, but the material isn't a critical factor in producing that electric guitar sound we know so well. An ordinary (acoustic) guitar makes sound entirely by vibration. When you pluck a string, it vibrates back and forth, transmitting sound energy into the hollow wooden body of the guitar, making it (and the air inside) resonate and amplifying the sound (making it considerably louder). As discussed, most electric guitars have solid bodies that are thinner (and sometimes much smaller) than those of acoustic guitars. Most bodies of electric guitars are vary considerably in size, shape and construction, and may be constructed of various materials. Most bodies could be made from a simple integral casting of metal such as aluminum. Early electric guitars were made from all kinds of materials, including molded Bakelite (one of the first plastics) and sheets of soldered brass.

Electric guitars are powered by electromagnetism—and electromagnetic induction to be precise. The metal strings of an electric guitar make electricity when you move them. The guitar strings near the magnet becomes magnetized by the magnetic field. As it vibrates, it makes a changing magnetic field of its own. Under the strings, there are electricity-generating devices called pickups. Each one consists of one or more magnets with hundreds or thousands of coils of very thin wire wrapped around them. The magnets generate a magnetic field all around them that passes up through the strings. As a result, the metal strings become partially magnetized and, when they vibrate, make a very small electric current flow through the wire pickup coils. A bar magnet in the pickup generates a magnetic field all around it. The magnetic field extends invisibly upward through the metal guitar strings above the pickup. The pickups are hooked up to an electrical circuit and amplifier, which boosts the small electric current and sends it on to a loudspeaker, making the familiar electric guitar sound. The pickup coils are wired to the amplifier through an electrical circuit. The circuit usually also contains volume and tone controls, which allow the basic sound to be adjusted by turning knobs on the guitar body. A guitar with two pickups will have four knobs on its body: one to adjust the volume and the tone of the sound from each pickup. More complex circuits can be added to change the sound of an electric guitar in all kinds of interesting ways. Usually, the amplifier and loudspeaker are built into a single unit called an "amp," or short for amplifier.

Review of Related Technology:

EP2674940A1 teaches a guitar case where at least an amplifier unit and a speaker unit connected to an output unit of the amplifier unit are integrally provided in a case main body portion, comprising: the speaker unit, which includes one or two or more speakers disposed in a panel portion of the case main body portion in which a neck portion of a guitar is housed and which faces a rear surface of the neck portion; an adjustment operation unit, which is disposed on the case main body portion at a position in the vicinity of the speaker unit, is connected to the amplifier unit, and is capable of being operated from at least an outside; a connector unit, which is disposed on the case main body portion, is connected to an input unit of the amplifier unit, and includes a microphone jack to which at least a microphone can be connected; and a power supply unit that supplies DC power to the amplifier unit.

CN 102243864A discloses a stringed instrument with a solar photovoltaic power generation system for supplying power for a music sensor, belonging to the technical field of new energy Internet of Things. According to the invention, sunlight irradiates a solar battery to generate current, the current is transmitted into a controller so as to be adjusted, and the current output from the controller is supplied to the music sensor and a wireless transmitting antenna through leads. A player plucks stings on a string column with fingers to sound music, and the music resonates in a resonance chamber by virtue of a perforated sound board, an acoustic sensor in the music sensor detects and senses the change of physical quantity information of the music, the change of physical quantity information of the music is converted into an electric signal by a conversion element in the music sensor, the electric signal is transmitted to the air by the wireless transmitting antenna installed on the music sensor, and audiences at different places receive the electric signal through wireless receiving antennae and then input the electric signal in a computer system for processing.

CN103761957 teaches a solar power musical instrument which mainly comprises a violoncello head, solar cell panels, strings, sound holes, a telescopic handle, a controller, a fiddlestick, a violoncello body, a base and a string fixing plate, wherein the violoncello head is arranged on the upper portion of the violoncello body, the solar cell panels are arranged on the front side and the back side of the violoncello body, the strings are arranged on the upper portion of the string fixing plate, the sound holes are formed in the two sides of the lower portion of the strings, the telescopic handle is arranged on the right side of the strings, the controller is arranged on the lower portion of the string fixing plate, and the base is arranged on the lower portion of the violoncello body. A controller display screen and the solar cell panels are arranged, so that light transmittance and work efficiency are improved, energy consumption is lowered, maintenance cost is further reduced, the automation degree and real-time detection performance of the solar power musical instrument are improved, and the work efficiency is improved.

CN201378422Y teaches a multi-string tamburitza with a digital keyboard. The multi-string tamburitza is a sounding component which comprises a digital electro acoustic component and a manual mechanical sounding component; the digital electro acoustic component comprises a microcomputer used for the tamburitza and externally fixed on the side plate surfaces of the resonator of the tamburitza, a 3G mobile phone and a fixing slot thereof, a combined power supply, a mini power amplifying loudspeaker for the tamburitza, a multi-functional audio/video/power input/output terminal block for the tamburitza, a tamburitza neck keyboard, a resonator keyboard, a decorative illuminating lamp for the tamburitza, and a connecting circuit. Because the digital electro acoustic component is arranged, without connecting any external power amplifier or sound equipment, the music sound of various music instruments such as an electric guitar and an electric box guitar and various rhythms can be emitted, the Internet can be logged in, video and audio works can be edited and processed, Kara OK accompaniment can be performed, video and audio recording materials can be stored, recorded and played, and performance and accompaniment can be carried out to substitute a band. The voice of the singer can be reverberated, modulated, amplified and output through a wired or wireless microphone.

CN 203376961U discloses an a piano solar energy electronic music score which comprises a shell, a liquid display screen, a USB spigot, a function selecting button, a switch, a microphone, a solar energy panel, a loudspeaker, a storage battery and a control unit. One surface of the shell is provided with the liquid display screen, and the other surface of the shell is provided with the solar energy panel and the loudspeaker. The side surface of the shell is provided with the USB spigot, the function selecting button, the switch and the microphone. The internal part of the shell is provided with the storage battery and the control unit. Compared with music scores in the prior art, beneficial effects of the piano solar energy electronic music score are that the piano solar energy electronic music score has characteristics of being simple in structure, convenient to use, economic in energy, scientific and practical and long in the service life. The internal part of the shell is provided with the control unit so that an objective of page turning of the music score can be automatically realized via a voice acquiring module and a processing module. After playing, mistakes and flaws in a playing process of a player can be displayed so that effects of piano learning and playing are effectively enhanced, a scene of playing interruption is avoided and thus the piano solar energy electronic music score has broad market prospects.

CN204411714U teaches a solar electronic organ toy which consists of an organ body, organ keys, a loudspeaker, a solar power generation panel, a functional keyboard, a lithium battery, a charging/discharging inverter circuit, electronic elements and a charging socket. The solar power generation panel and a lithium battery pack are adopted for storing electricity as a green free energy source of the electric organ toy; more precision electric elements are configured, so that the troubles that the electricity of the battery is used up and a power supply of a power network is required to be connected are avoided, the effect that the electronic organ toy is used at any place can be realized easily, conveniently and quickly; the solar electronic organ toy has the advantages of compact structure, light weight and simplicity for operation.

JPH07114372A discloses a high electronic musical instrument of opportunity to be used outdoors, the power supply circuit mainly composed of two battery, charging and discharging control circuit and a solar cell attached to the panel surface through the Connect the said charging and discharging control circuit, under the condition that the solar cell generates an output equal to or higher than a predetermined voltage, characterized by performing control such as to charge the secondary battery by the solar cell, solar cell built-in electronic musical instrument. 2. A solar cell built-in electronic musical instrument according to claim 1, wherein the musical instrument is a musical instrument for marching band.

Various systems are known in the art. However, their structure and means of operation are substantially different from the present disclosure. No device known in the art is fully made of a body which contains the capability of harnessing the power of the sun. The art teaches amps, speakers, and battery, being built into a single guitar case, but not in the body of an instrument as discussed in the present invention. Most of the musical instruments taught in the art do not disclose a musical instrument being a guitar. Any other musical instrument disclosed do not contain solar panels on the actual instrument itself. No musical instruments in the art solve the problem of having all of a guitar's component pieces all in the same instrument and all of which are powered by solar power. The other inventions fail to solve all the problems taught by the present disclosure. At least one embodiment of this invention is presented in the drawings below and will be described in more detail herein.

SUMMARY OF THE EMBODIMENTS

In general, the present invention succeeds in conferring the following, and others not mentioned, benefits and objectives.

The present invention discloses a musical instrument, comprising; at least one solar panel adapted and configured to correspond to a body of the of the musical instrument: where the at least one solar panel is outwardly facing the sun; a battery adapted and configured to store solar energy; a power control board; an amplifier; an interactive display for monitoring a plurality of levels corresponding to a variety of components of the musical instrument; a strap connected to the musical instrument; said strap adapted and configured with at least one solar panel; at least one speaker for emitting sound; a bridge; a port; a stand; said stand adapted and configured with the at least one solar panel; and a carrying case; said carrying case adapted and configured with the at least one solar panel.

The musical instrument further comprises a guitar. The musical instrument also comprises at least one solar panels which are custom die cut to correspond to the body of the musical instrument. The at least one solar panels are held to the musical instrument through a plurality of locking magnets. The battery, power control board, amplifier and processor are internal components of the musical instrument. The plurality of levels includes diagnostics related to the battery, charging energy, and solar energy. The musical instrument further comprises a display to control volume and a strap that is comprised of stretchable material. The musical instrument further comprises a potentiometer. The carrying case further comprises at least one solar panel which is flexible. The solar energy captured and stored by the strap can be transferred to the musical instrument. The solar energy captured and stored by the carrying case can be transferred to the musical instrument. The solar energy captured and stored by the strap can be transferred to the carrying case.

A stand for a musical instrument, comprises an elongated structure for receiving a musical instrument; said elongated structure configured with an outward armature; a microphone located on one opposing end; at least one magnet located on the other opposing end; said at least one magnet adapted and configured for locking the musical instrument to the elongated structure of said stand; a locking latch; said locking latch adapted to secure the outward armature in a locked position; and at least one solar panel for storing solar energy. The solar energy captured and stored by the musical instrument stand can transferred to the musical instrument.

It is an object of the present invention to comprise a musical instrument with the amplifier as part of the musical instrument and not as a separate component.

DESCRIPTION OF THE PREFERRED EMBODIMENTS

Figure 1A:
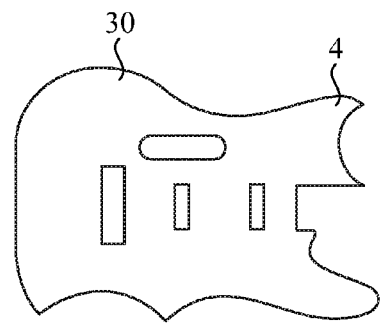
FIG. 1A is a perspective view of the body of the present invention.

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto. In fact, those of ordinary skill in the art may appreciate upon reading the present specification and viewing the present drawings that various modifications and variations can be made thereto.

Figure 1B:
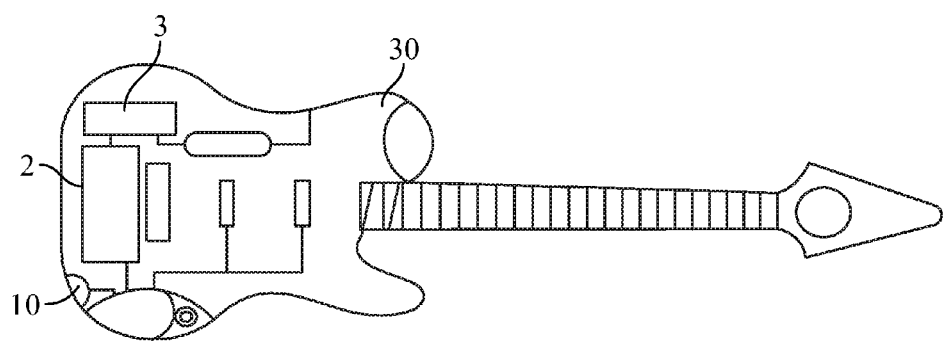
FIG. 1B is a front side interior perspective view of the present invention.
Figure 1C:
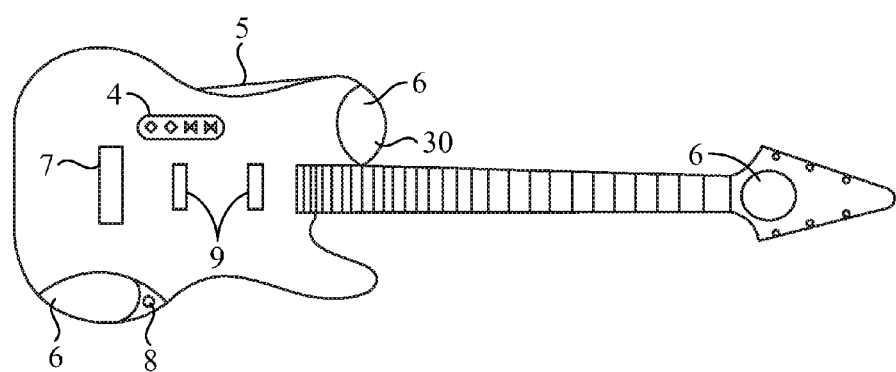
FIG. 1C is a back side interior perspective view of the present invention.

Referring to FIGS. 1A and 1B, a perspective view of the present invention is shown, both from the outside and inside, respectively. The present invention comprises custom cut solar panels which comprise the body 30 of the present invention. The body 30 also comprise a battery and circuit controller 2, an amplifier or processor 3, a power control board 4, a display 5, speakers 6, a bridge 7 and a solar port 10. FIG. 1C shows the sound control 8 and sound pick-ups 9 of the present invention. The bridge anchor the strings to the body 30 of the present invention. In another embodiment the bridge may be attached to a tremolo arm, a lever that's often referred to as the whammy bar. The whammy bar loosens and tightens multiple springs within the body of the guitar, which distorts the sound and creates a wavering effect. In another embodiment the present invention may comprise a whammy bar. In the present embodiment the pickups 9 comprise the most important part of the electric guitar's technology. The pickup may be a set of six magnets wrapped thousands of times in copper wire thinner than a human hair. In another embodiment, the guitars may have two or three pickups, and each magnet corresponds to a particular string on the guitar. The magnets in a pickup 9 produce a stable magnetic field when the guitar is at rest. Once the guitarist strums or plucks the strings, the vibrations disturb the field and induce an electric current in the coil. Thus, when the strings are plucked, any given string (not shown) on the present invention vibrate at a certain frequency. This electric current is then carried to the input jack and then through to the amplifier 3 for processing of the sound. The amplifier 3 reduces noise and interference in the present invention's sound.

The solar panels on the body 30 of the present invention 1 work like all solar panels. All solar energy captured by the solar panels of the present invention are comprised of photovoltaic cells which covert sunlight to electricity. Many of these cells are linked together to form solar panels. The solar panels 1 work by allowing photons, or particles of light, to knock electrons free from atoms, generating a flow of electricity to power the components of the present invention. Many cells linked together make up a solar panel. The solar panels of the present invention may be comprised of two or more slices of semi-conducting material, preferably silicon. In another embodiment, the solar panels may be comprised of any semi conducting materials.

The present invention comprised a plurality of solar panels 1 that cover the body 30 of the guitar and which produce the electric energy which is stored in a battery 2. The battery processes the solar energy to power the control board 4, which powers the inner sound amplifier 3, thereby causing sound to emit from the speakers 6. The whole operation is monitored by a user through the display 5. The display may show the charge level of the battery and comprise a tuner. In another embodiment the present invention may comprise a plurality of guitar styles as well as possesses various capabilities such as drum kits/bits, sampling, recording, Wi-Fi, cordless, and mobile phone interaction capacity. In another embodiment, the custom solar panels may be fitted to other electric musical instruments and operate in the same manner such as keyboards, drums, and bass.

There's a vast variety of solar panels on the market today. They are durable, encapsulated, water and weather proof and can be custom cut to any shape and size and mounted on any surface. Small solar panels are often arranged into solar modules consisting of 50-100 or more individual solar units. The solar panels, as shown in FIG. 1 are traditionally attached with Philips screws to the biodegradable hemp plastic body of the guitar. The panels also serve as a cover for the inner parts of the guitar, as shown in FIG. 1B and FIG. 1C. They are easily removable for service or replacement. Said solar panels also can be partly kept in place by magnets. That will reduce the number of the screws and fasten the removal of the solar panels.

Figure 2:
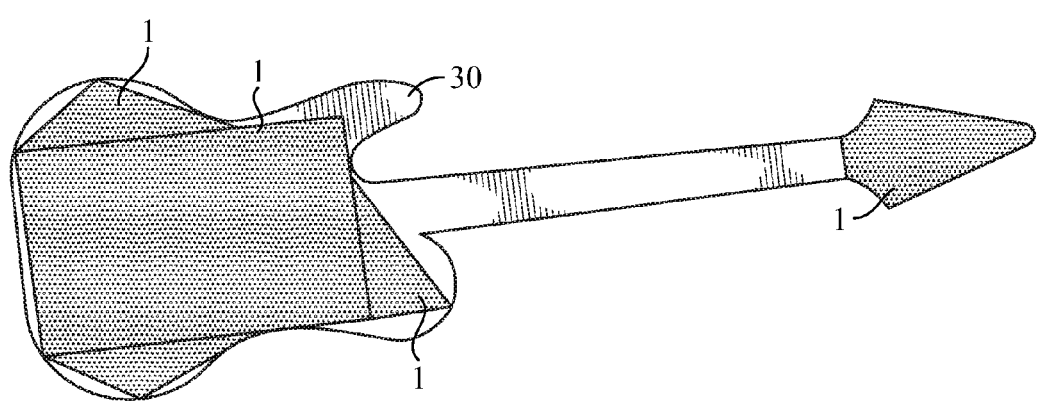
FIG. 2 is a back perspective view of the present invention.

Referring to FIG. 2, a back view of the present invention is shown showing the plurality of solar panel modules 1, also custom cut to fit the electric guitar. The back of the guitar, as shown in FIG. 2 is covered with powerful solar panels or modules 1 that serve as the main charging surface used to jump start/fast charge the guitar. The main central solar module 1 can be opened for the fast charge while serving as a guitar stand. The front facing solar panels as shown in FIG. 1 keep the battery 2 levels up while the guitar is being played. The locking magnets 12 (as shown in FIG. 3A) keep the guitar in place, while the locking latch 14 (as shown in FIG. 3A) locks the solar module 1 in the open position.

Figure 3A:
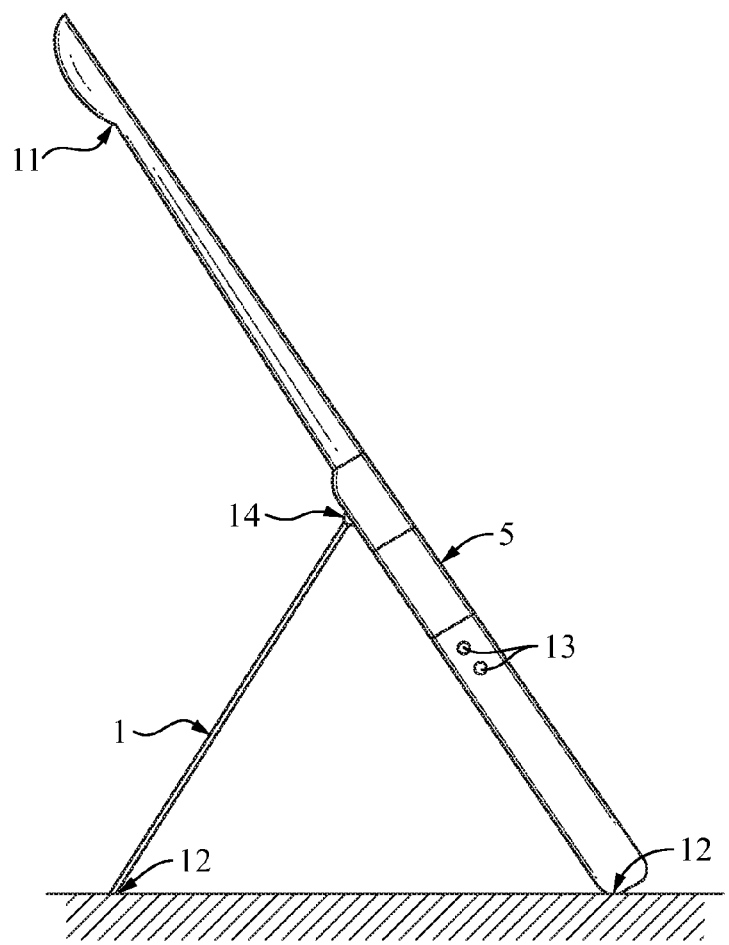
FIG. 3A is a perspective view of a stand for the present invention.

FIG. 3A is a perspective view of a stand for the present invention. FIG. 3A shows additional solar panels. The stand also comprises its own display 5 and a built-in microphone 11. The stand can double as a microphone stand when the guitar is in use. The guitar is attached to the stand by locking magnets 12. The stand contains various control buttons 13 to control, volume and power. Once the guitar is placed on the stand, the guitar is secured to the stand by a locking latch 14. The control buttons may comprise volume and tone knobs which adjust how the guitar sounds. The volume knob can make the guitar sound louder or softer, while the tone knob acts more like a filter. It interacts with a capacitor to get rid of high frequencies and extracts a fuller, warmer sound.

Figure 3B:
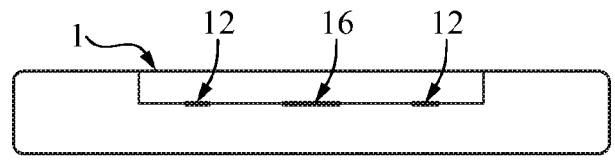
FIG. 3B shows a side perspective view of the stand for the present invention.

FIG. 3B shows a side perspective view of the stand for the present invention in its closed position. The locking magnets 12 keep the guitar in the stand in a closed position. The guitar can be charged by placing it on a lawn or against a tree. The solar module can be opened by hand with the help of the notch 16 and the locking latch 14 will lock the stand in the open or closed position. The locking magnets 12 will lock or unlock the guitar. The locking magnets 12 may be controlled by the control board 4 as shown in FIG. 1C. The stand may serve as a guitar stand, or it may act to increase the charge power of the guitar via its own solar panels 1. When the guitar is locked into the stand and its case (as shown in FIG. 4a) the case acts to cool the inner sections of the guitar.

Figure 4A:
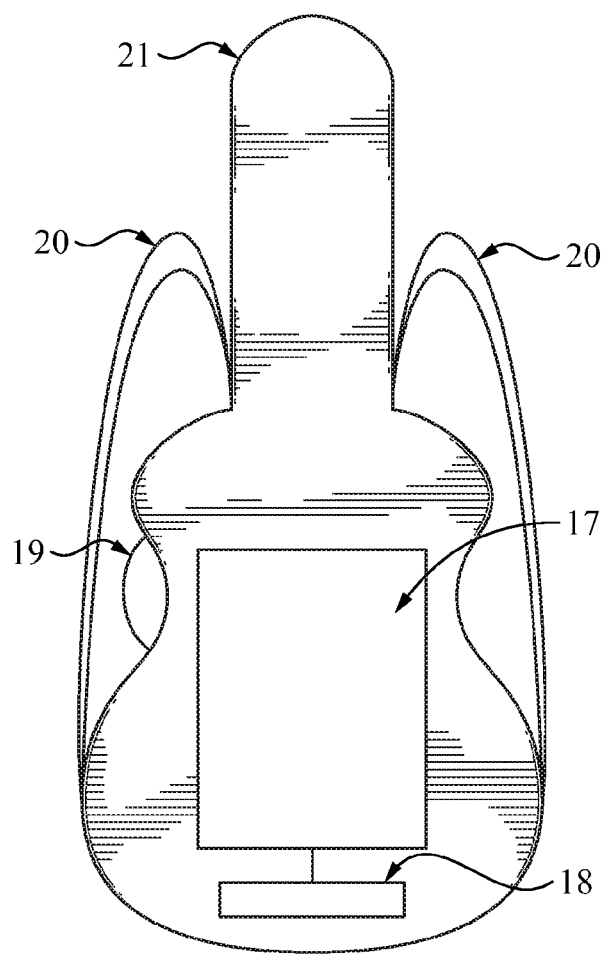
FIG. 4A shows a perspective view of a case for the present invention.
Figure 4B:
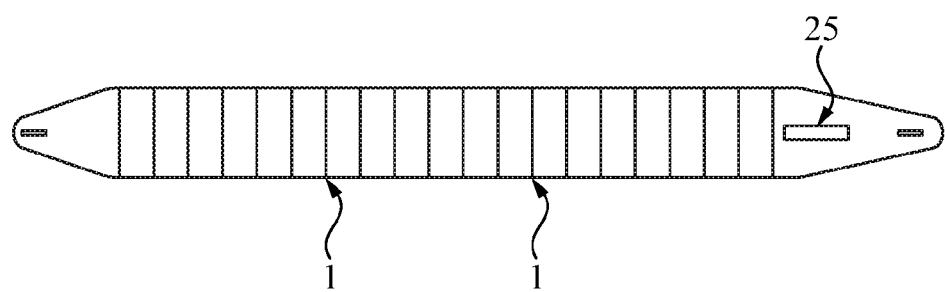
FIG. 4B shows a perspective view of a strap for the present invention.

FIG. 4A shows a perspective view of a case for the present invention. FIG. 4 shows additional solar panels 17 built into the case. The case also comprises a built-in solar battery 18 for capturing and storing any solar energy as well as a handle 19. The case also comprises back straps 20 and is made of a semi-hard hemp fabric 21. FIG. 4B shows a perspective view of a strap for the present invention. The strap may be made of stretchable material and is covered with solar panels 1. The strap comprises a sliding potentiometer 25 which assists in the control of the guitar's volume. As shown in FIG. 4A, the flexible solar panels 17 of the strap may be attached to the body of case 21 and acts to charge the built-in battery 18. While in the case, the guitar may be charged by connection to the battery 18.

Figure 5:
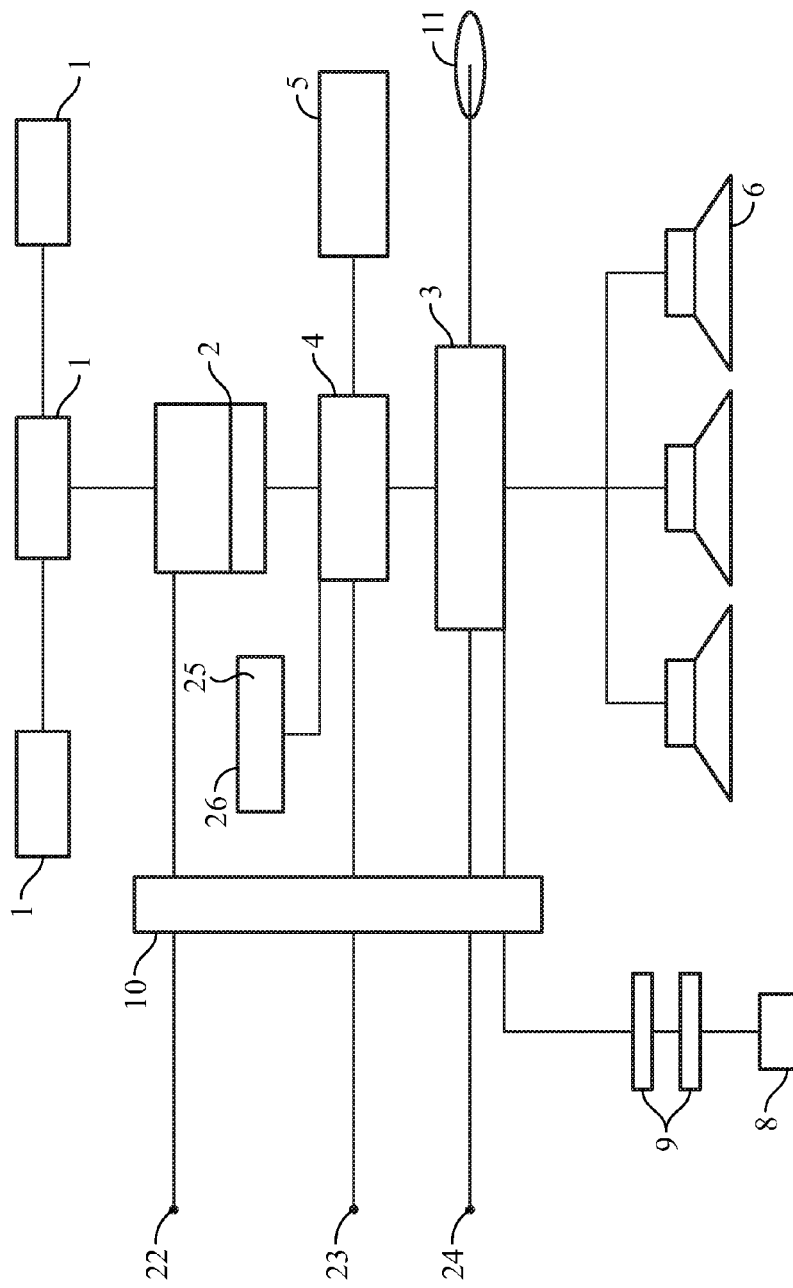
FIG. 5 shows a perspective view of a circuit diagram of the electrical system of the present invention.

FIG. 5 shows a perspective view of a circuit diagram of the electrical system of the present invention. The solar panels 1 capture the energy of the sun. This energy is stored in a battery 2 which may also contain a circuit controller for circulating the solar energy to the guitar's components. Solar energy powers the amplifier 3 which may contain a processor. The solar energy may also power a control board 4 and an outward facing display 5 on the guitar. The solar energy circuit may also power the guitar's speakers 6 as well as display buttons such as the sound control 8. The sound pickups 9 on the guitar are also powered by the solar energy circuit as is the sliding potentiometer 25. Any solar energy captured by the stand or the strap 26 is able to be fed to the guitar through the port 10 on the face of the guitar.

The solar energy captured by the sun may also power the built in microphone 11. Similar to other guitar's the guitar may also be powered by standard direct current switch or input 22, whether the direct current is 12 volt to 20 volt. The guitar may also work in conjunction with various application or device plug ins through a USB input 23, ¼ inch output jacks 27 and contains other various input lines 24.

Most electric guitars are completely passive. That is, they consume no power, and you don't have to plug them into a power supply. The present invention teaches a guitar that can not only power itself through its custom solar panels but then use that captured solar energy to power the rest of the guitar's components. The amplifiers job is to take the guitar's signal and make it audible by boosting it enough to drive a speaker. In the present invention, the amp is powered by the solar panels on the guitar as well as the stored energy by the solar panels on the stand and strap.

The present invention interacts with mobile phones, androids, iOS, notebooks, etc., providing the necessary charge, bringing entertainment and light to camping sites, schools, parties, art/music venues, rock arenas, etc. In another embodiment, the present invention's captured solar energy may be used to power a dead car battery. The present invention may be used by children, adults and people of all ages. In another embodiment, the components of the present invention may be 3D printed. The present invention may be used an educational tool that encourages outside activities, teaches ecology and environmental awareness.

In another embodiment, the present invention may comprise a smart card, thereby allowing for a multifunctional computer/robot like functionality. The guitar may greet the owner with welcoming music and a question. In another embodiment, the may self-tune or change the tuning. In another embodiment, the guitar may comprise voice command recognition, fingerprint recognition, and other biometric functions. In another embodiment, the guitar may comprise two video cameras, whereby the guitar will scan the surroundings and adapt the sound and operation to the changing conditions. In another embodiment, quartz crystals may be incorporated in the design of the guitar. In another embodiment, "space" metals such as titanium or griffin, gold, silver, etc., may be used in the composition of the guitar or the solar panels. In another embodiment, a laser beam may be projected from the top of the guitar for entertainment or defense reasons. In another embodiment, the bio hemp plastic body of the guitar might incorporate a piano keys octave that will make it a breeze to perform and record. In another embodiment, the strap will have emergency motion charge features enabling the guitar to charge in extreme conditions without the need for sunlight.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A musical instrument, comprising;
    at least one first solar panel adapted and configured to correspond to a body of the musical instrument: where the at least one first solar panel is outwardly facing the sun;
    a battery adapted and configured to store solar energy received from the at least one first solar panel;
    a power control board;
    an amplifier;
    an interactive display for monitoring a plurality of levels corresponding to a variety of components of the musical instrument;
    a strap connected to the musical instrument; said strap adapted and configured with at least one second solar panel;
    at least one speaker for emitting sound;
    a bridge;
    a port;
    and
    a carrying case; said carrying case adapted and configured with the at least one third solar panel.

2. The musical instrument of claim 1, further comprising a guitar.

3. The musical instrument of claim 1, wherein the at least one first solar panel is custom die cut to correspond to the body of the musical instrument.

4. The musical instrument of claim 1, wherein the at least one first solar panel is secured to the musical instrument through a plurality of locking magnets.

5. The musical instrument of claim 1, wherein the battery, power control board, amplifier and processor are internal components of the musical instrument.

6. The musical instrument of claim 1, wherein the plurality of levels includes diagnostics related to the battery, charging energy, and solar energy.

7. The musical instrument of claim 1, wherein the interactive display is configured to control volume.

8. The musical instrument of claim 1, further comprising a potentiometer.

9. The musical instrument of claim 1, wherein the carrying case further comprises at least one third solar panel which is flexible.

10. The musical instrument of claim 1, wherein a solar energy captured and stored by the strap is transferred to the musical instrument.

11. The musical instrument of claim 1, wherein a solar energy captured and stored by the carrying case is transferred to the musical instrument.

* * * * *